US009461039B2

(12) United States Patent
Levin et al.

(10) Patent No.: US 9,461,039 B2
(45) Date of Patent: Oct. 4, 2016

(54) DIE INCLUDING A SCHOTTKY DIODE

(71) Applicant: Tower Semiconductor Ltd., Migdal Haemek (IL)

(72) Inventors: Sharon Levin, Haifa (IL); David Mistele, Haifa (IL)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 63 days.

(21) Appl. No.: 14/622,873

(22) Filed: Feb. 15, 2015

(65) Prior Publication Data

US 2016/0240529 A1    Aug. 18, 2016

(51) Int. Cl.
| | |
|---|---|
| H01L 29/49 | (2006.01) |
| H01L 27/08 | (2006.01) |
| H01L 27/07 | (2006.01) |
| H01L 29/872 | (2006.01) |
| H01L 29/06 | (2006.01) |
| H01L 27/02 | (2006.01) |

(52) U.S. Cl.
CPC ....... *H01L 27/0814* (2013.01); *H01L 27/0207* (2013.01); *H01L 27/075* (2013.01); *H01L 27/0727* (2013.01); *H01L 29/0649* (2013.01); *H01L 29/872* (2013.01)

(58) Field of Classification Search
CPC ........... H01L 27/0814; H01L 27/0207; H01L 27/0727; H01L 27/075; H01L 29/0649; H01L 27/872
See application file for complete search history.

(56) References Cited

U.S. PATENT DOCUMENTS

| | | | |
|---|---|---|---|
| 6,693,308 B2 * | 2/2004 | Sankin | H01L 29/0619 257/102 |
| 6,784,489 B1 * | 8/2004 | Menegoli | H01L 27/0727 257/339 |
| 8,129,814 B2 | 3/2012 | Pendharkar et al. | |
| 8,390,001 B2 * | 3/2013 | Shimizu | H01L 21/8213 257/213 |
| 9,178,079 B2 * | 11/2015 | Kono | H01L 29/872 |
| 9,230,958 B2 * | 1/2016 | Kinoshita | H01L 29/6606 |

* cited by examiner

*Primary Examiner* — Michael Shingleton
(74) *Attorney, Agent, or Firm* — Reches Patents

(57) ABSTRACT

According to an embodiment of the invention there may be provided a die that may include (a) a first region of a first type; (b) a first conductor that contacts the first region; (c) a substrate having a substrate portion of the first type; wherein the substrate portion contacts the first region; an intermediate region of a second type; wherein the first type and the second type are selected from an n-type semiconductor and a p-type semiconductor; wherein the first type differs from the second type; (d) a second region of the second type; (e) a second conductor that contacts the second region; (f) a third region of the second type; (g) a third conductor that contacts the third region; (h) a fourth region of the first type; wherein the third region contacts the fourth region and does not contact the intermediate region; (i) a fourth conductor that contacts the intermediate region to form a first Schottky diode. A doping concentration of the intermediate region may be lower that a doping concentration of each one of the second region and the third region. A doping concentration of the substrate portion may be lower than a doping concentration of the first region. The third and fourth conductors may be electrically coupled to each other.

18 Claims, 12 Drawing Sheets

DIE INCLUDING A SCHOTTKY DIODE

BACKGROUND OF THE INVENTION

Rectifying circuits that include Schottky diodes are often used as (a) external components to power management Integrated Circuit (PMIC) designs, (b) Rectifier in a bootstrap circuit, (c) a free wheeling diode in a boost or (d) a buck convertor in asynchronous switch mode power supply (SMPS).

A Schottky diode that is integrated on a single silicon chip (die) is preferable to a discrete Schottky diode due to its lower cost and size and reduced wire parasitic inductances. Integrated Schottky diodes however may inject current to the substrate and disturb the circuits performance. Such a Schottky diode may include an N-well that contacts a Schottky conducting pad.

In order to suppress leakage current of Schottky diodes, the Rectifying circuit also includes a guard ring. The guard ring includes a guard conducting pad that is contacted by a P+ region. The P+ region is surrounded by a P well. The P well contacts the N well.

The P well and the N well form a PN diode.

The PN diode and the Schottky diode are electrically coupled to each other in parallel.

In reverse bias the guard ring assists in depleting the semiconductor in proximity to a metal Anode of the switching circuit thus reducing the local fields in the metal semiconductor interface and hence increasing the breakdown voltage and lowering the leakage current.

When the PN and the Schottky diodes are in forward bias at above 0.6V the PN diode opens and injects minority carriers into the lightly doped N well located above a substrate. This minority charge slows down the turn-off process of the Rectifying circuit also referred as the reverse recovery charge. It also may diffuse through the N well to the substrate of the Rectifying circuit thus causing high substrate currents. These currents may interfere with the analog control circuitry on chip and cause circuit failure.

There is a growing need to provide a fast and highly efficient Rectifying circuit that includes a Schottky diode.

SUMMARY

According to an embodiment of the invention there may be provided a die that may include (a) a first region of a first type; (b) a first conductor that contacts the first region; (c) a substrate having a substrate portion of the first type; wherein the substrate portion contacts the first region; an intermediate region of a second type; wherein the first type and the second type are selected from an n-type semiconductor and a p-type semiconductor; wherein the first type differs from the second type; (d) a second region of the second type; (e) a second conductor that contacts the second region; (f) a third region of the second type; (g) a third conductor that contacts the third region; (h) a fourth region of the first type; wherein the third region contacts the fourth region and does not contact the intermediate region; (i) a fourth conductor that contacts the intermediate region to form a first Schottky diode. A doping concentration of the intermediate region may be lower that a doping concentration of each one of the second region and the third region. A doping concentration of the substrate portion may be lower than a doping concentration of the first region. The third and fourth conductors may be electrically coupled to each other.

The third region may be prevented from being directly coupled to the intermediate region.

The die may include a substrate port, a cathode port and an anode port, wherein the cathode port may be coupled to the first conductor, the anode port may be coupled to the third and fourth conductors and the cathode port may be coupled to the second conductor.

The maximal distance between each one of the first, second, third, fourth regions may not exceed ten microns.

The first type may be an n-type semiconductor or a p-type semiconductor.

The die may also include a fifth region of the second type; a fifth conductor that contacts the fifth region; a sixth region of the first type; wherein the fifth region contacts the sixth region and does not contact the intermediate region; a seventh region of the second type; a sixth conductor that contacts the seventh region; an eighth region of the first type; a seventh conductor that contacts the eighth region; wherein the doping concentration of the intermediate region may be lower that a doping concentration of each one of the eighth region and the sixth region; and wherein the fifth conductor may be electrically coupled to the fourth and third conductors; wherein the sixth conductor may be electrically coupled to the second conductor; wherein the seventh conductor may be electrically coupled to the first conductor.

The die may include multiple Schottky diodes and multiple guard regions; wherein each of the multiple Schottky diodes may be positioned between two guard regions; wherein each of the multiple Schottky diodes may be formed by a conductor and the intermediate region; wherein each of the multiple guard regions may be of the second type; wherein each guard region does not contact the intermediate region; wherein the multiple Schottky diodes may include the first Schottky diode; wherein the multiple guard regions may include the fourth region.

The multiple Schottky diodes and the multiple guard regions may be parallel to each other or be arranged in any other arrangement.

The multiple Schottky diodes and the multiple guard regions may be electrically coupled in parallel to each other.

The fourth region may surround the third region.

The fourth region may only partially surround the third region.

The die may include at least one isolating region; wherein the at least one isolation region and the fourth region may prevent the third region from contacting the intermediate region.

The die may include shallow trench isolators that are positioned between the first, second, third and fourth conductors.

The die may include polysilicon regions that are positioned between the first, second, third and fourth conductors.

The die may include complementary metal oxide transistors.

The die may include bipolar transistors, complementary metal oxide transistors and double diffused metal oxide transistors.

The fourth region may be prevented from being directly coupled to either one of the fourth conductor and the fifth conductor.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
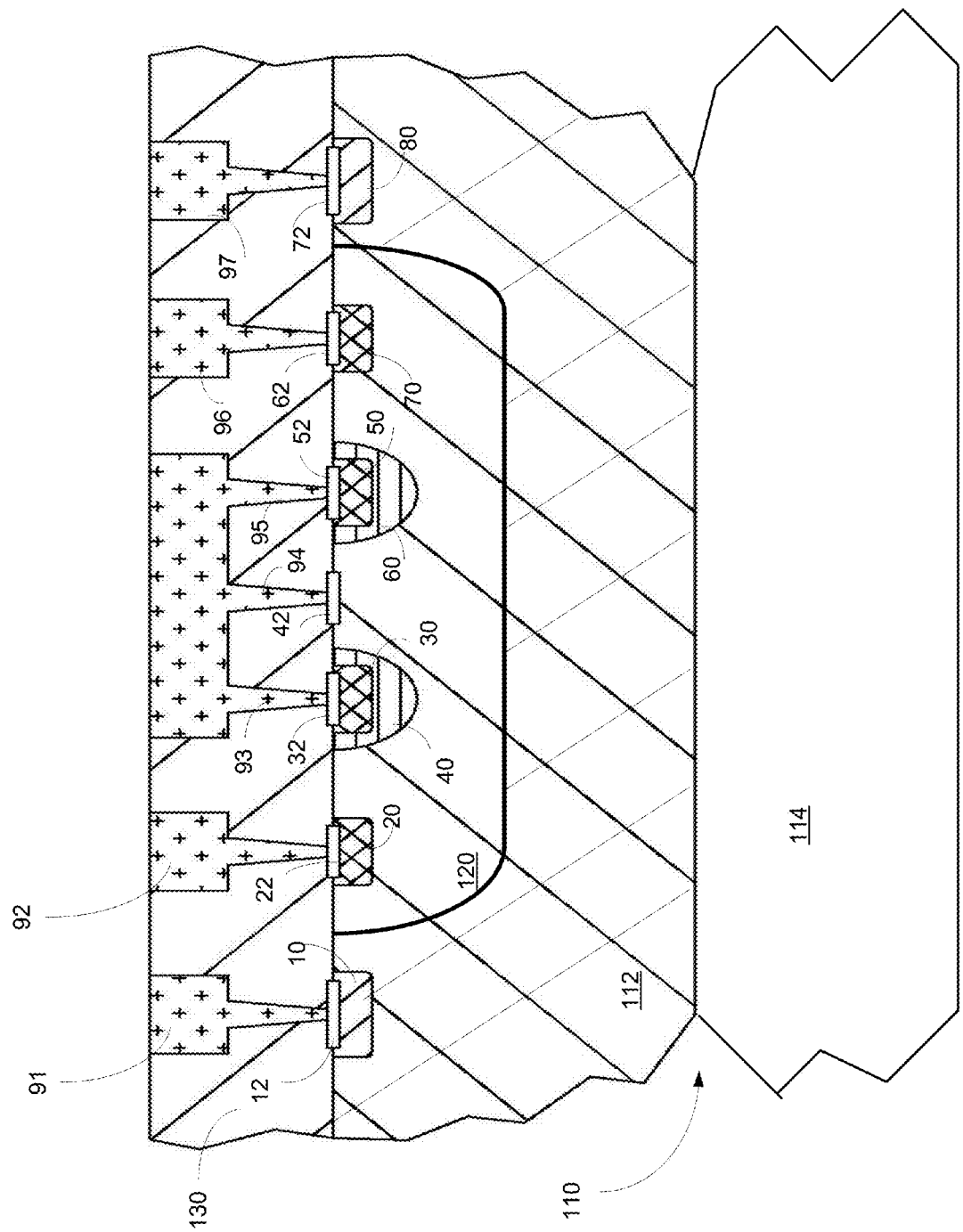
FIG. 1 illustrates a rectifying circuit of a die according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

As used herein, the terms "doped region", "implant", and "well" refer to contiguous regions of a semiconductor substrate that are characterized by a predominance of a selected dopant type (a P-type semiconductor or an N-type semiconductor) that produces a desired conductance in a manner well known in the art.

For convenience, regions exhibiting this predominance of P-type or N-type carriers are referred to herein as having a P-type or N-type doping concentration, or having a P- or N-conductivity type.

The terms "P+" and "N+" are used herein to denote such regions/implants/wells of relatively high doping concentrations. It is noted that different regions that are associated with the term N+ may be of the same doping concentration but may differ from each other by their doping concentration. The same applies to regions associated with the term P+.

The terms "P−" and "N−" are used herein to denote such regions/implants/wells of relatively low doping concentrations. It is noted that different regions that are associated with the term N− may be of the same doping concentration but may differ from each other by their doping concentration. The same applies to regions associated with the term P−.

The term "directly coupled" means a coupling by a conductor.

The term "first type" and "second type" include P-type semiconductors of any doping concentration and N-type semiconductors of any doping concentration.

In addition, directional terms such as "upper", "under" and "over" are intended to provide relative positions for purposes of description, and are not intended to designate an absolute frame of reference.

According to various embodiments of the invention there may be provided a die that may include a rectifying circuit that may include one or more Schottky diodes.

The rectifying circuit may:
  a. Hold high reverse bias with small leakages due to the guard regions.
  b. Be very fast due to prevention of minority carrier rejection and reduced capacitance.
  c. Exhibit lower energy loss due to the prevention of minority carrier injection.
  d. Exhibit lower voltage ringing during turn-off.

The rectifying device may be used for various purposes such as high power switching. It may be used, for example, as a freewheeling diode, as an asynchronous switch with low turn on and low charge reverse recovery, may be used for charging a bootstrap capacitor or may be used for other purposes.

FIG. 1 illustrates a switching circuit 102 that belongs to a die according to an embodiment of the invention.

The rectifying circuit 102 may include at least some of the following regions and conductors:
  a. A first region 10 of a first type.
  b. A first conductor 12 that contacts the first region.
  c. A substrate 110 having a substrate portion 112 of the first type. FIG. 1 also shown another portion 114 of the substrate.
  d. An intermediate region 120 of a second type.
  e. A second region 20 of the second type.
  f. A second conductor 22 that contacts the second region 20.
  g. A third region 30 of the second type.
  h. A third conductor 32 that contacts the third region 30.
  i. A fourth region 40 of the first type, wherein the third region 30 contacts the fourth region 40 and does not contact the intermediate region 120.
  j. A fourth conductor 42 that contacts the intermediate region 120 to form a first Schottky diode.
  k. A fifth region 50 of the second type.
  l. A fifth conductor 52 that contacts the fifth region.

m. A sixth region 60 of the first type, wherein the fifth region 50 contacts the sixth region 60 and does not contact the intermediate region 120.
n. A seventh region 70 of the second type.
o. A sixth conductor 62 that contacts the seventh region 70.
p. An eighth region 80 of the first type; (p) a seventh conductor 72 that contacts the eighth region 80.

The fourth conductor can be made of CoSi, any other Silicide material or from other metals which are deposited over this region.

The doping concentration of the intermediate region 120 may be lower that a doping concentration of each one of the second region 20, the third region 30, the sixth region 60 and the eighth region 80.

The third conductor 32 is electrically coupled to the fourth and fifth conductors 42 and 52.

FIG. 1 also shows that first, second, third, fourth, fifth, sixth and seventh conductors 12, 22, 32, 42, 52, 62 and 72 are shaped as a pad—although any other shape can be used. The conductors may be positioned few microns from each other (for example between 2 and 5 microns from each other).

The first till seventh conductors are coupled to first till seventh additional conductors 91-97, respectively. Third, fourth and fifth additional conductors are electrically coupled to each other. The first till seventh additional conductors 91-97 may be formed in dielectric layer 130.

The fourth and sixth regions 40 and 60 act as guard regions. The fourth region 40 is of a first type and is positioned between the third region 30 and the intermediate region 120—both of second type—thereby forming two PN diodes of reverse polarity that are serially connected to each other.

These two PN diodes (see, for example, FIG. 4) prevent (or at least substantially attenuate) the injection of minority carriers to the substrate. The same applies to the sixth region 60—it is of the second type and is positioned between the first region 50 and the intermediate region 120—both of the first type to form—thereby forming two PN diodes of reverse polarity that are serially connected to each other.

Figure 5:
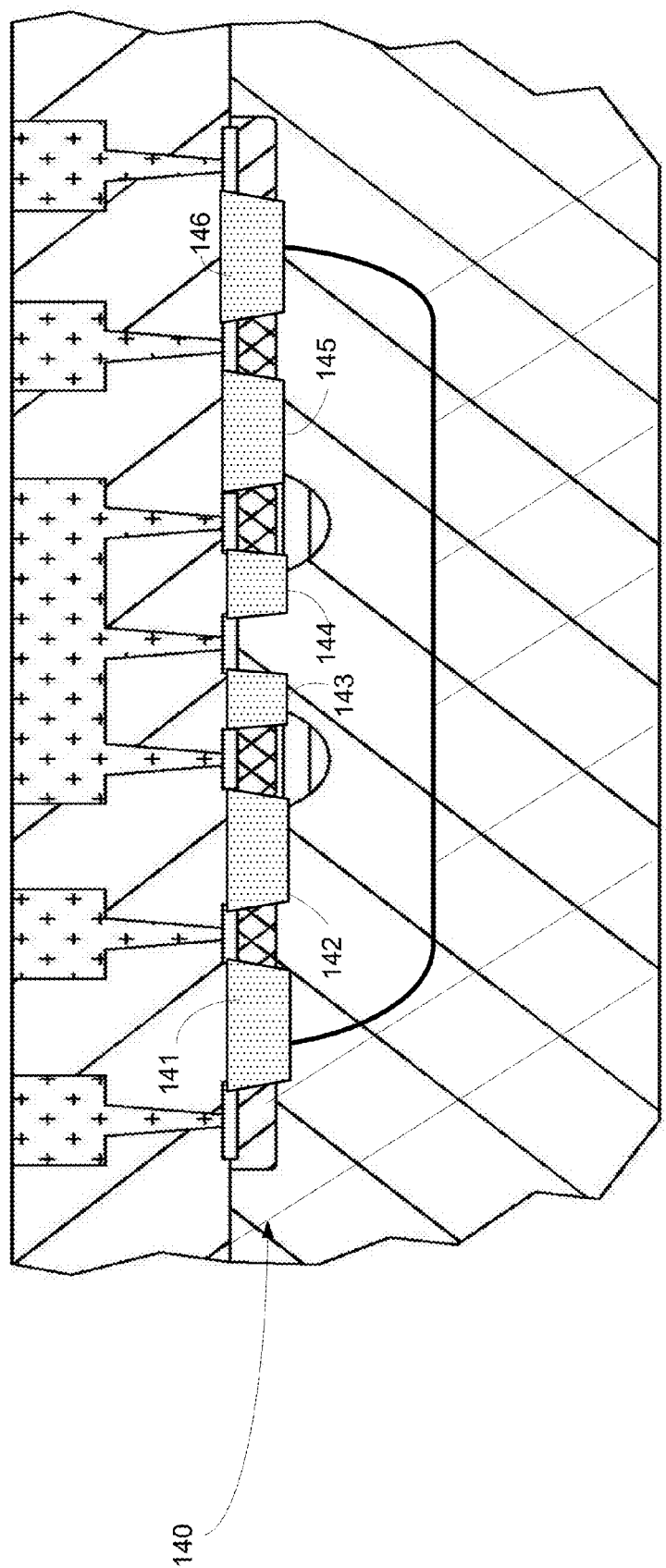
FIG. 5 illustrates a rectifying circuit of a die according to an embodiment of the invention.
Figure 6:
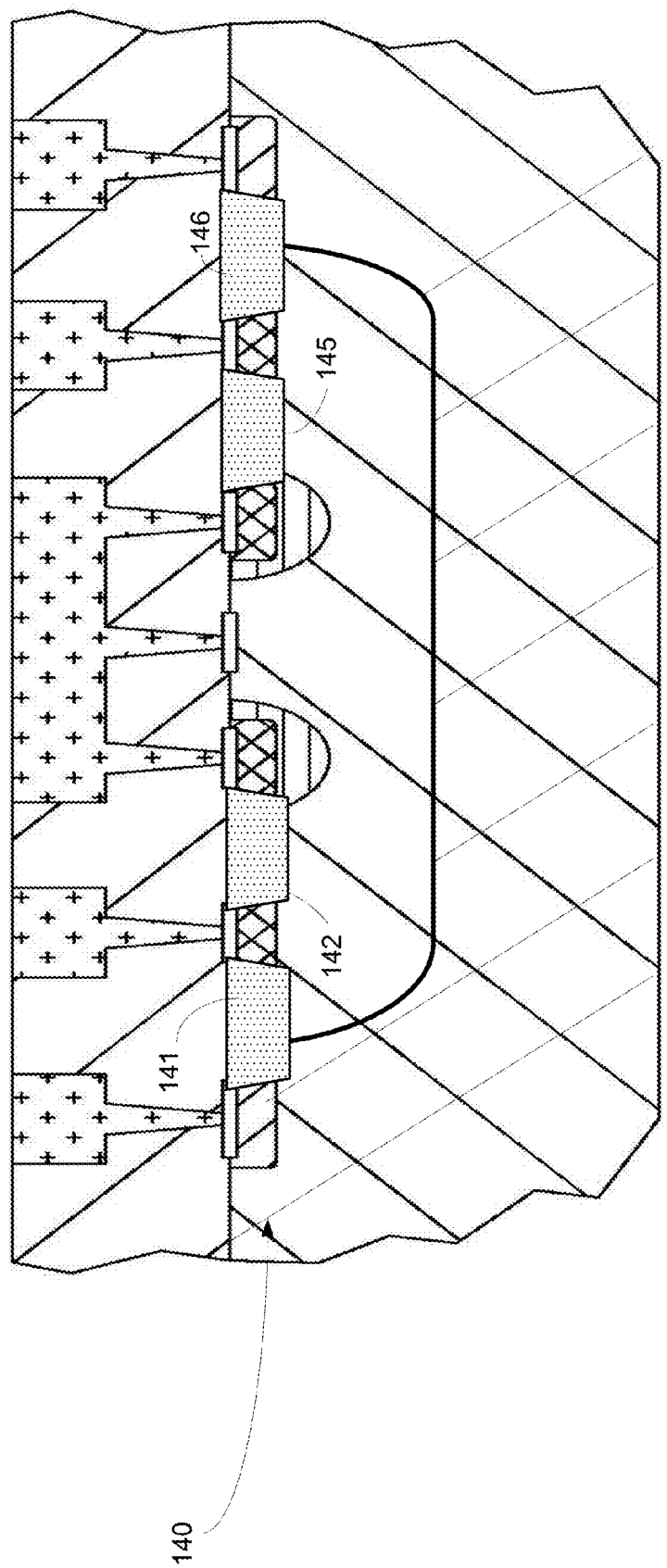
FIG. 6 illustrates a rectifying circuit of a die according to an embodiment of the invention.

It is noted that at least some of the conductors may be separated from each other by isolators and that several regions may be separated from each other by isolators. FIGS. 5 and 6 provide examples of such isolators.

Figure 2:
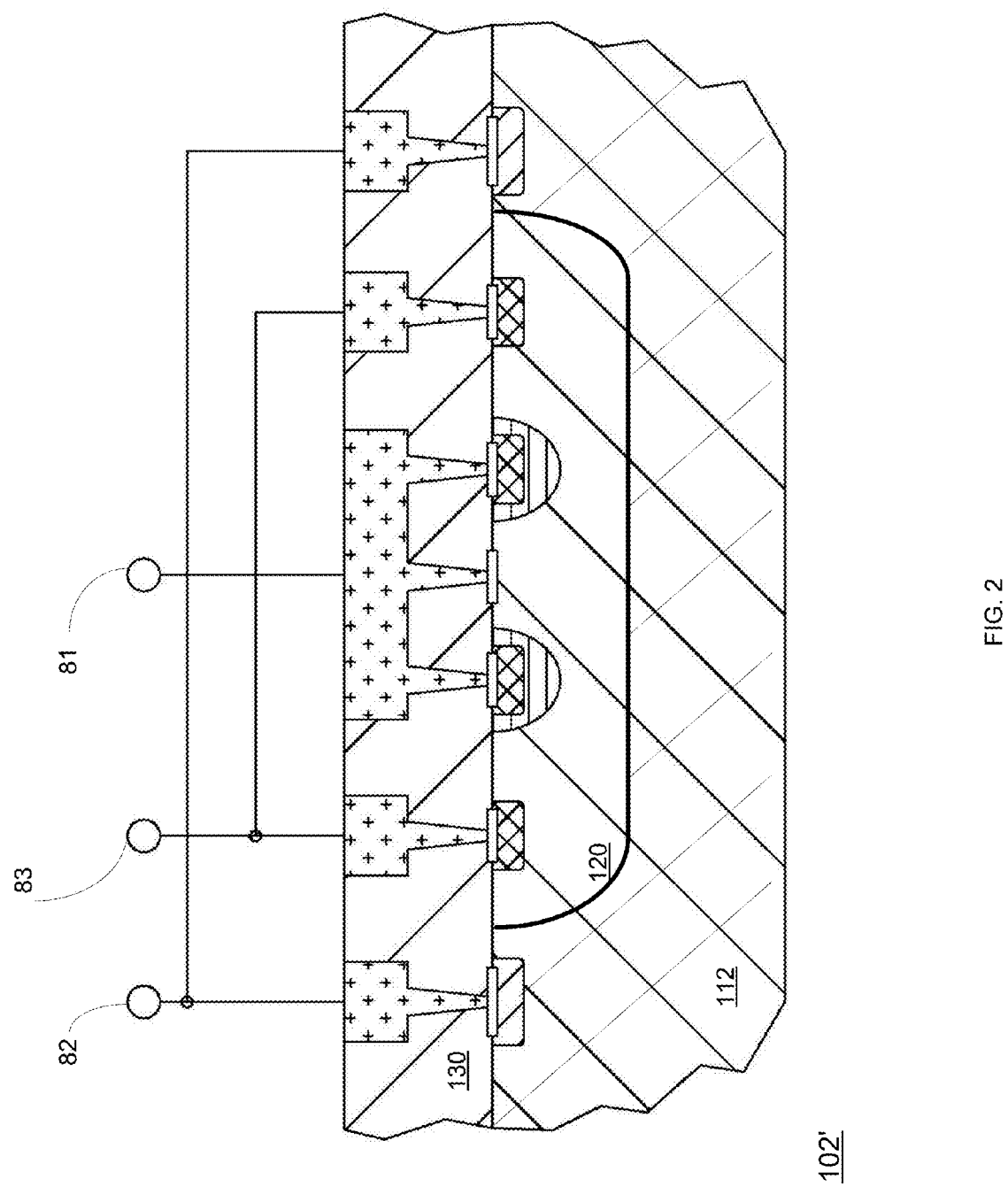
FIG. 2 illustrates a rectifying circuit of a die according to an embodiment of the invention.

FIG. 2 illustrates a rectifying circuit 102' that belongs to a die according to an embodiment of the invention.

FIG. 2 further illustrates an anode port 81, a substrate port 82 and a cathode port 83.

The anode port 81 is coupled to the third, fourth and fifth conductors 32, 42 and 52 via third till fifth additional conductors 93-95.

The cathode port 83 is coupled to the second and sixth conductors 22 and 62 via second and sixth additional conductors 92 and 96.

The substrate port 82 is coupled to the first and seventh conductors 12 and 72 via the first and seventh intermediate conductors 91 and 97.

Figure 3:
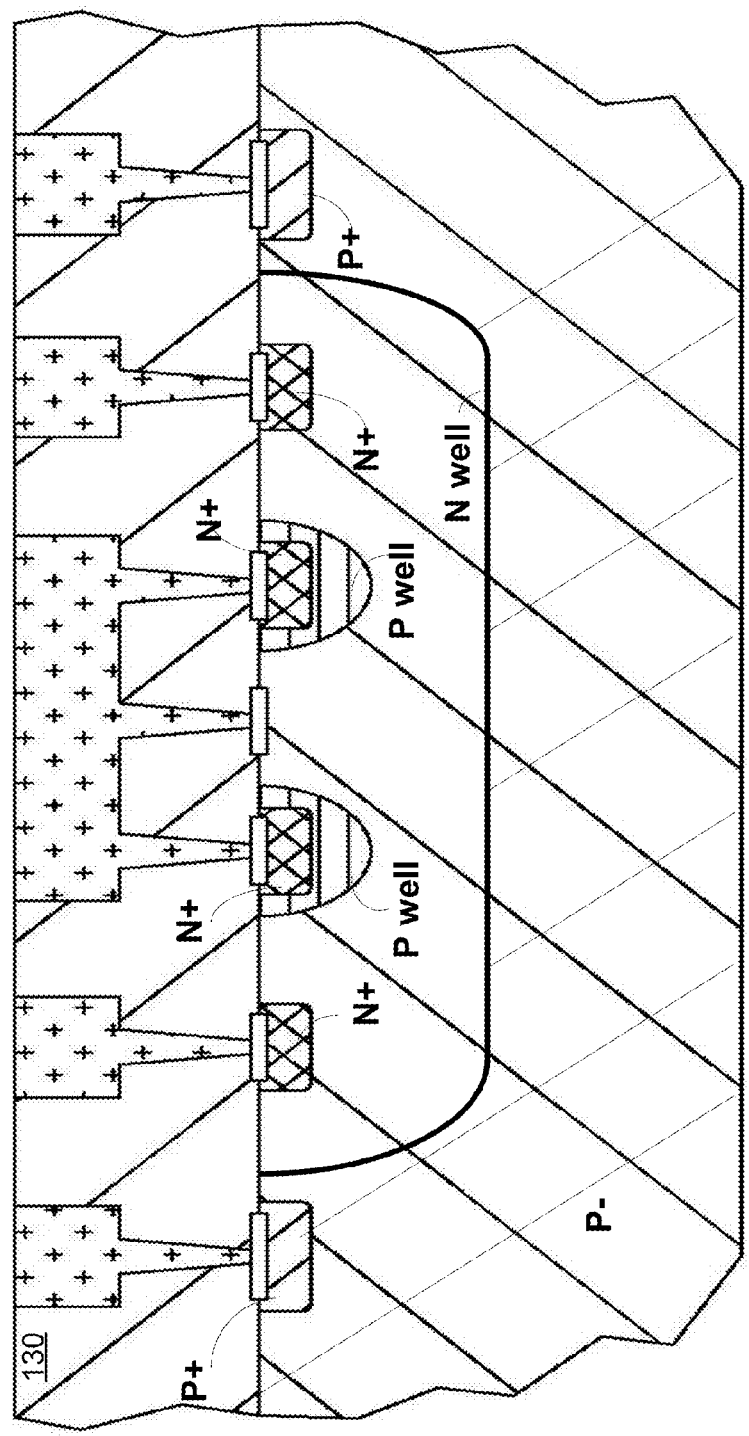
FIG. 3 illustrates a rectifying circuit of a die according to an embodiment of the invention.

FIG. 3 illustrates a rectifying circuit 103 that belongs to a die according to an embodiment of the invention where the first type is a p-type semiconductor.

In rectifying circuit 103:
a. The first and eighth regions 10 and 80 are P+.
b. The substrate portion 112 is P−.
c. The fourth and sixth regions 40 and 60 are P wells.
d. The second, third, fifth and seventh regions are N+.
e. The intermediate region 120 is an N−.

Non-limiting values of doping concentrations and dimensions are provided below:

| | Junction depth [um] | Dopant Concentration [#/cm^3] | Resistivity |
|---|---|---|---|
| N+ | 0.2 | 10^20 | |
| P+ | 0.2 | 10^20 | |
| Pwell | 1~2 | 10^17 | |
| Nwell | 3~4 | 10^16 | |
| Psub | | | 1~1000 ohm · cm (typically for power 10 ohm · cm) |

Non-limiting electrical values are:
a. Von ~0.3V (depending on the Metal type and SC doping)
b. Reverse Breakdown (BV)—20~100V
c. Reverse Leakage 1~100 pA/um^2 @25 C.

Figure 4:
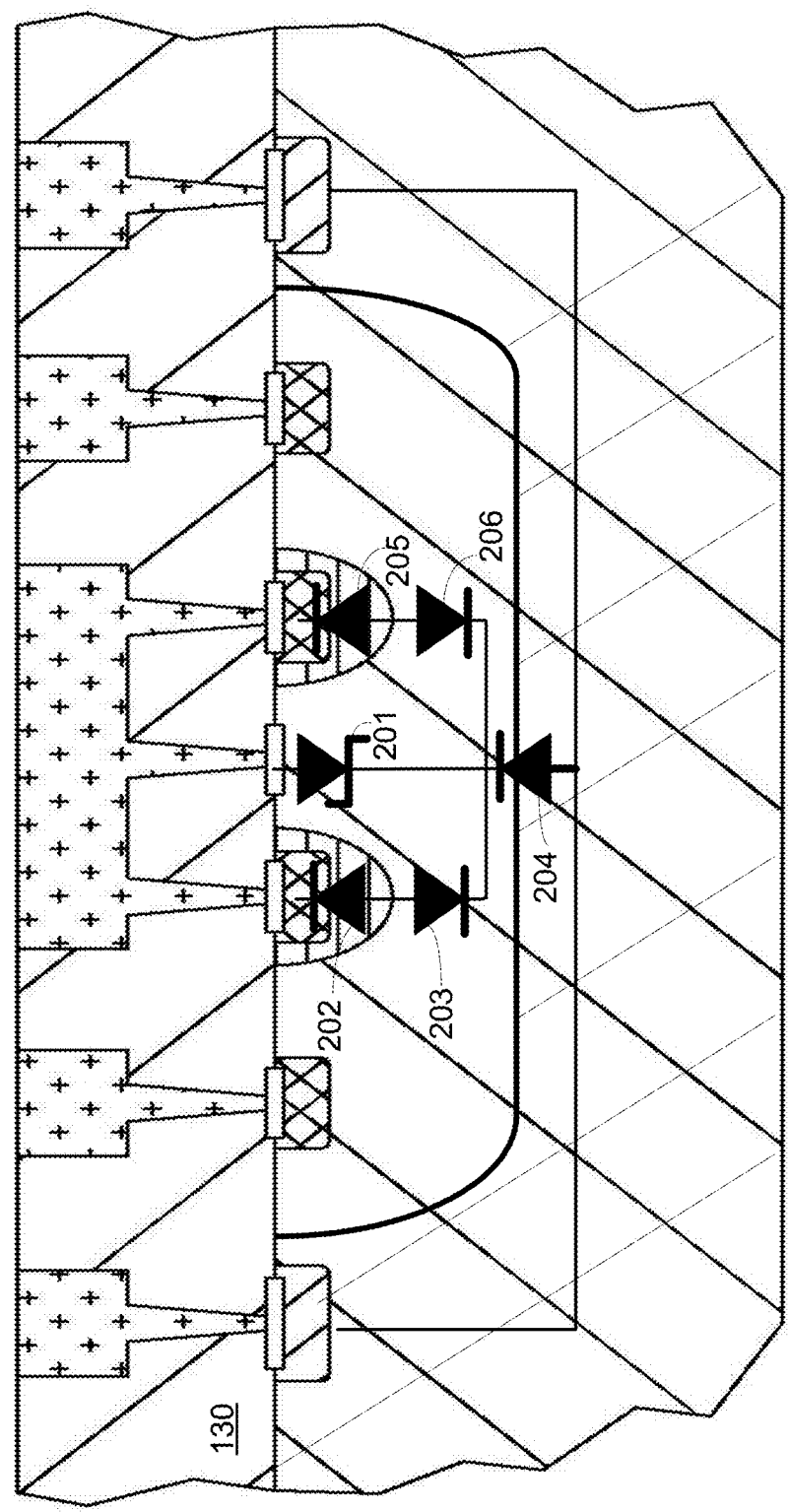
FIG. 4 illustrates a rectifying circuit of a die according to an embodiment of the invention.

FIG. 4 illustrates the diodes formed in the rectifying circuit according to an embodiment of the invention.

Schottky diode 201 is formed between the fourth conductor 42 and the intermediate region 120. The anode of the Schottky diode 201 is formed at the fourth conductor and its cathode is formed at the intermediate region 120.

An anode of first PN diode 202 is formed at the fourth region 40 and its cathode is formed at the third region 30.

An anode of a second PN diode 203 is formed at the third region 30 and its cathode is formed at the intermediate region 120.

The first and second PN diodes 202 and 203 are serially connected to each other and are in opposite polarity—their anodes are connected to each other.

An anode of third PN diode 205 is formed at the sixth region 40 and its cathode is formed at the fifth region 30.

An anode of a fourth PN diode 206 is formed at the fifth region 30 and its cathode is formed at the intermediate region 120.

The third and fourth PN diodes 205 and 206 are serially connected to each other and are in opposite polarity—their anodes are connected to each other.

The reverse polarity of first and second PN diodes 202 and 203 prevents minority carriers to be injected to the substrate when the rectifying circuit is in forward bias and when the rectifying circuit is in a backward bias.

Furthermore—the serial connection of first and second PN diodes reduces the capacitance of the rectifying circuit (in relation to prior art rectifying circuits that included only one PN diode between the intermediate region and the substrate) and thus reduces the switching period of the rectifying circuit. The same applied to third and fourth PN diodes 205 and 206.

The intermediate region and the substrate form a fifth diode 204. The cathode of fifth diode 204 is coupled to the cathodes of the second PN diode, the fourth PN diode and the Schottky diode. The anode of the fifth diode 204 is formed in the substrate.

This arrangement of diodes—especially the two pairs of first and second PN diodes and third and fourth PN diodes prevent minority carriers to be injected from the third and fifth regions to the intermediate region and the substrate.

When the rectifying circuit is at a reverse bias to the structure, Schottky diode 201, second PN diode 203 and fourth PN diode 206 are reversed while first and third PN diodes 202 and 205 forward biased. This will force the fourth and fifth regions (both Pwell) to be at a potential, which is now isolated, to approximately +0.7V with respect to the third and fifth N+ regions, while all the remaining potential difference between the Anode port and the Cathode port of the rectifying device falls on the second and fourth PN diodes 203 and 206, hence the depletion between the Pwells still happens and the rectifying circuit exhibits a high breakdown voltage and low leakage.

When the rectifying circuit is in a forward bias the Schottky diode 201 opens at the barrier point (~0.3V in one embodiment). In that voltage the first till fourth PN diodes 202-203, 205 and 206 are still closed. Once the forward bias passes the voltage drop (at about 0.6 volts) of second and fourth PN diodes 203 and 206 is open however the first and third PN 202 and 205 are now reversed and block the minority carrier injection into the intermediate region (Nwell).

Because the rectifying device can be forward biased without injection of minority carriers, the reverse recovery time of the rectifying device is very short compared to the prior art device. It will result in higher efficiency circuits (less charge is lost in the turn-off stage), less ringing effect, and faster switching.

FIG. 5 illustrates a rectifying circuit 105 that belong to a die according to an embodiment of the invention.

Rectifying circuit 105 differs from rectifying circuit 102 by including shallow trench isolators 141-146 (STIs) that are positioned between each pair of conductors out of the first till seventh conductors 12, 22, 32, 42, 52, 62 and 72. These STIs (141-146) may also provide a barrier between (a) the first region 10 and the second region 20, (b) the second region 20 and the third region 30, (c) the Schottky diode 201 and the third and fifth regions 30 and 50, (d) the fifth region 50 and the seventh region 70, and (e) the seventh region 70 and the eighth region 80.

In FIG. 5 a pair of STIs (142 and 143) that is positioned on both side of the third region 30 and the fourth region 40 prevent a direct contact between the third region 30 and the intermediate region 120. Another pair of pair of STIs (144 and 145) that is positioned on both side of the fifth region 50 and the sixth region 60 prevent a direct contact between the fifth region 50 and the intermediate region 120.

Any one of the STIs (collectively denoted 140) may be replaced by another isolator. For example—each STI may be replaced by a thermal oxide (LOCOS) or a polysilicon region.

The first till seventh conductors 12, 22, 32, 42, 52, 62 and 72 may be configured to contact only the first region, second region, third region, intermediate region, fifth region, seventh region and eighth region respectively. Thus, they are prevented from contacting other regions of the rectifying circuit. This may be achieved by manufacturing these conductors by using Silicide blocking masks, positioning isolators between the conductors that prevent the conductors from contacting regions that were not supposed to contact, and the like.

FIG. 6 illustrates a rectifying circuit 106 that belong to a die according to an embodiment of the invention.

Rectifying circuit 106 differs from rectifying circuit 105 by including STIs 141, 142, 145 and 146 and by not including STIs 143 and 144.

Figure 7:
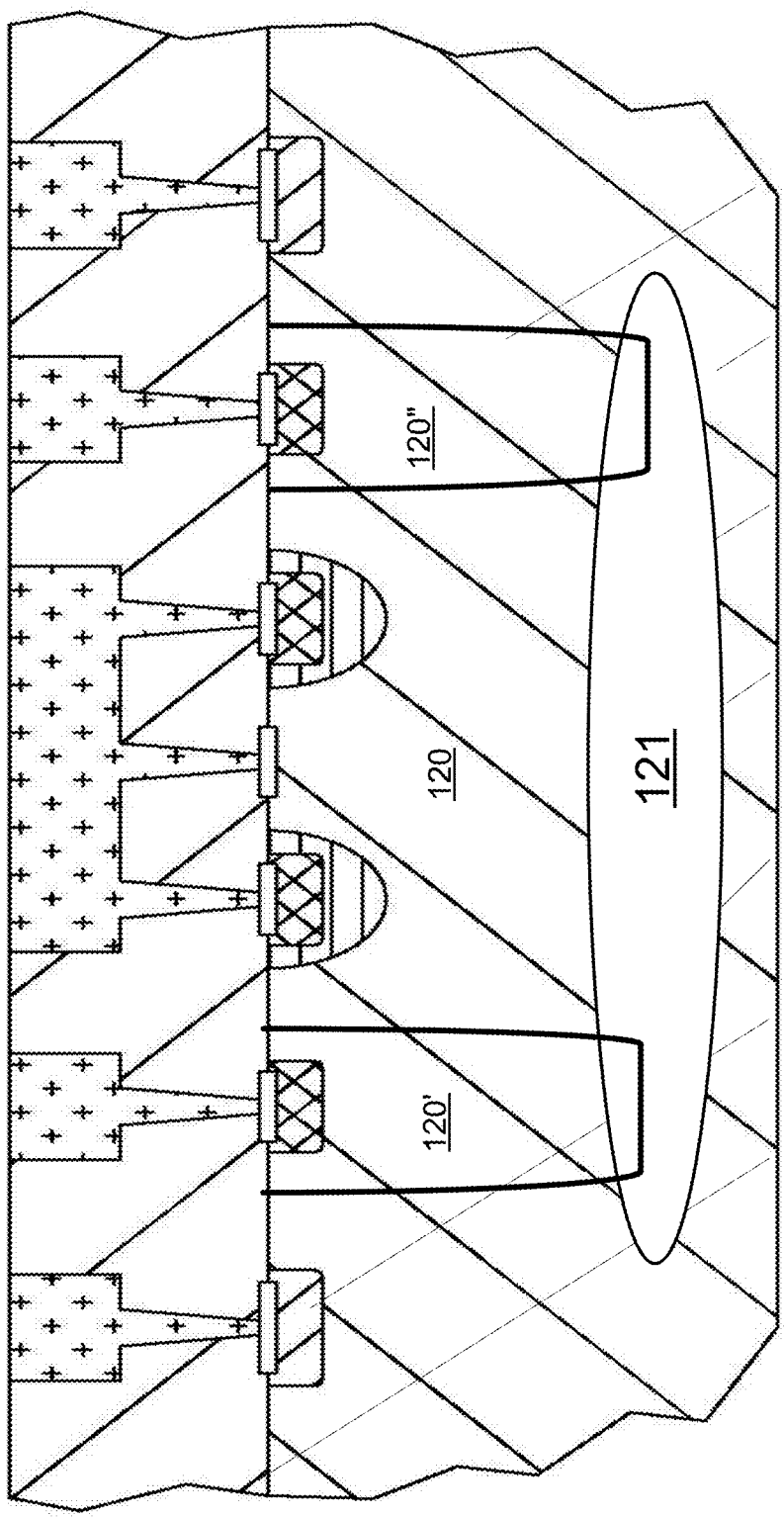
FIG. 7 illustrates a rectifying circuit of a die according to an embodiment of the invention.

FIG. 7 illustrates a rectifying circuit 107 that belong to a die according to an embodiment of the invention.

Rectifying circuit 107 differs from rectifying circuit 101 by including first, second third and buried intermediate regions 120, 120', 120" and 121 instead of a single intermediate region 120.

Buried intermediate region 121 is a highly doped buried N type region (or—if the substrate is of a N type—is of a highly doped buried P region).

Second and third intermediate regions 120' and 120" surround the second and seventh regions 20 and 70, respectively. They contact the buried intermediate region 121. First intermediate region 120 is surrounded by second intermediate region 120', third intermediate region 120" and buried intermediate region 121.

The different intermediate regions may be of the same doping concentration but may differ from each other by their doping concentration.

FIGS. 1-7 illustrates a rectifying device that included a single Schottky diode 201, two guard regions (fourth and sixth regions 40 and 60) and two interfacing regions (third and fifth regions 30 and 50) that are located between the guard regions and the corresponding conductors. The guard regions that are positioned at both sides of the single Schottky diode.

It is noted that the rectifying circuit may include multiple Schottky diodes and more than two guard regions and two interfacing regions. In a rectifying circuit that includes multiple Schottky diodes each Schottky diode should be positioned between two guard regions and two interfacing regions.

The number of Schottky diodes per rectifying circuit may be responsive to a maximal power that should be switched by rectifying circuit. Higher maximal power levels may require more Schottky diodes.

The Schottky diodes and the guard regions may be arranged in an interleaved manner.

One or more Schottky diodes may "share" a guard region and an interfacing region.

Alternatively, each pair of guard regions may be allocated to a single Schottky diode.

It is noted that some Schottky diodes may share a guard region while one or more other Schottky diodes may not share their guard regions.

Figure 8:
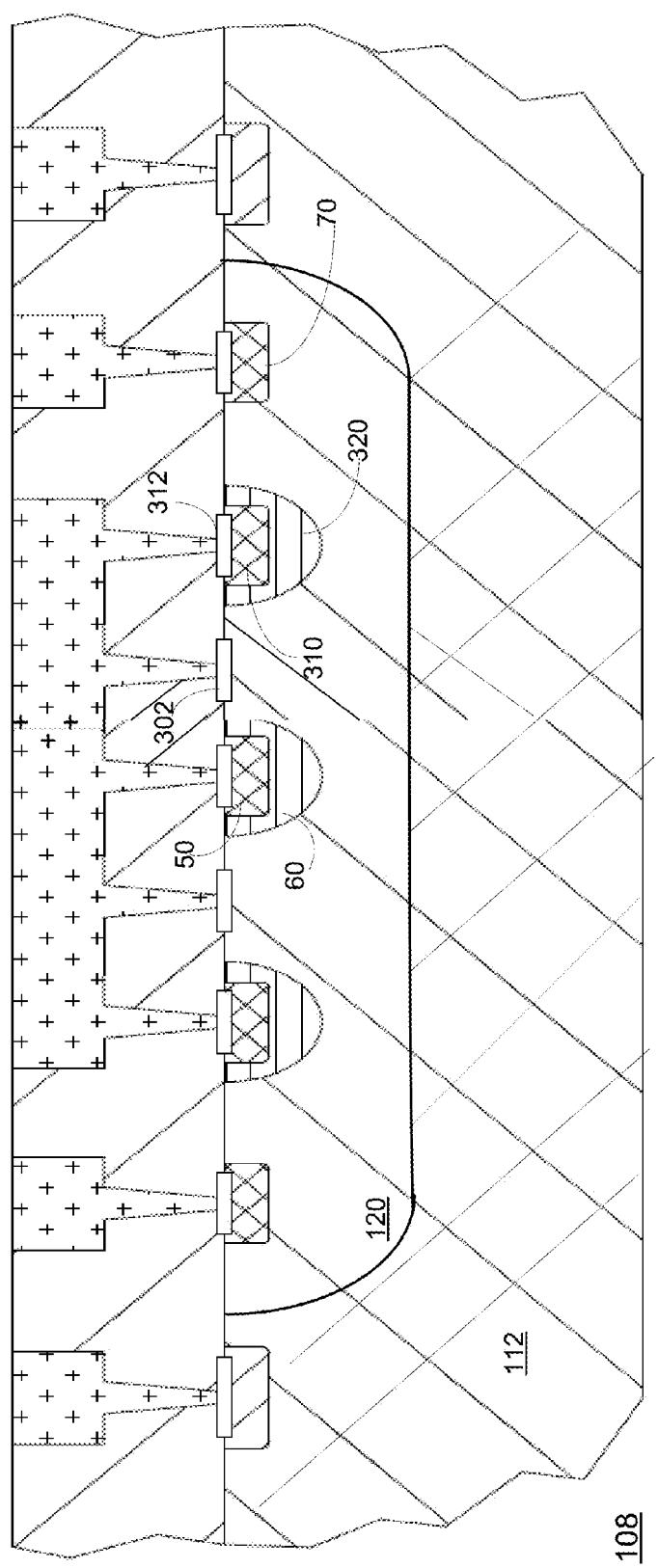
FIG. 8 illustrates a rectifying circuit of a die according to an embodiment of the invention.

FIG. 8 illustrates a rectifying circuit 108 that belong to a die according to an embodiment of the invention.

Rectifying circuit 108 differs from rectifying circuit 101 by including an additional Schottky diode (formed by eighth conductor 302 and intermediate region 120), an additional guard region 320, an additional interfacing region 310 and a tenth conductor 312. The additional guard region 302 is of the first type. The additional interfacing region 310 is of the second type and is prevented from contacting the intermediate region 120.

The additional Schottky diode is positioned between the fifth region 50 and the additional guard region 320. The additional Guard region 320 is positioned between the additional Schottky diode and the seventh region 70.

There may be more than two Schottky diodes per rectifying device.

Figure 9:
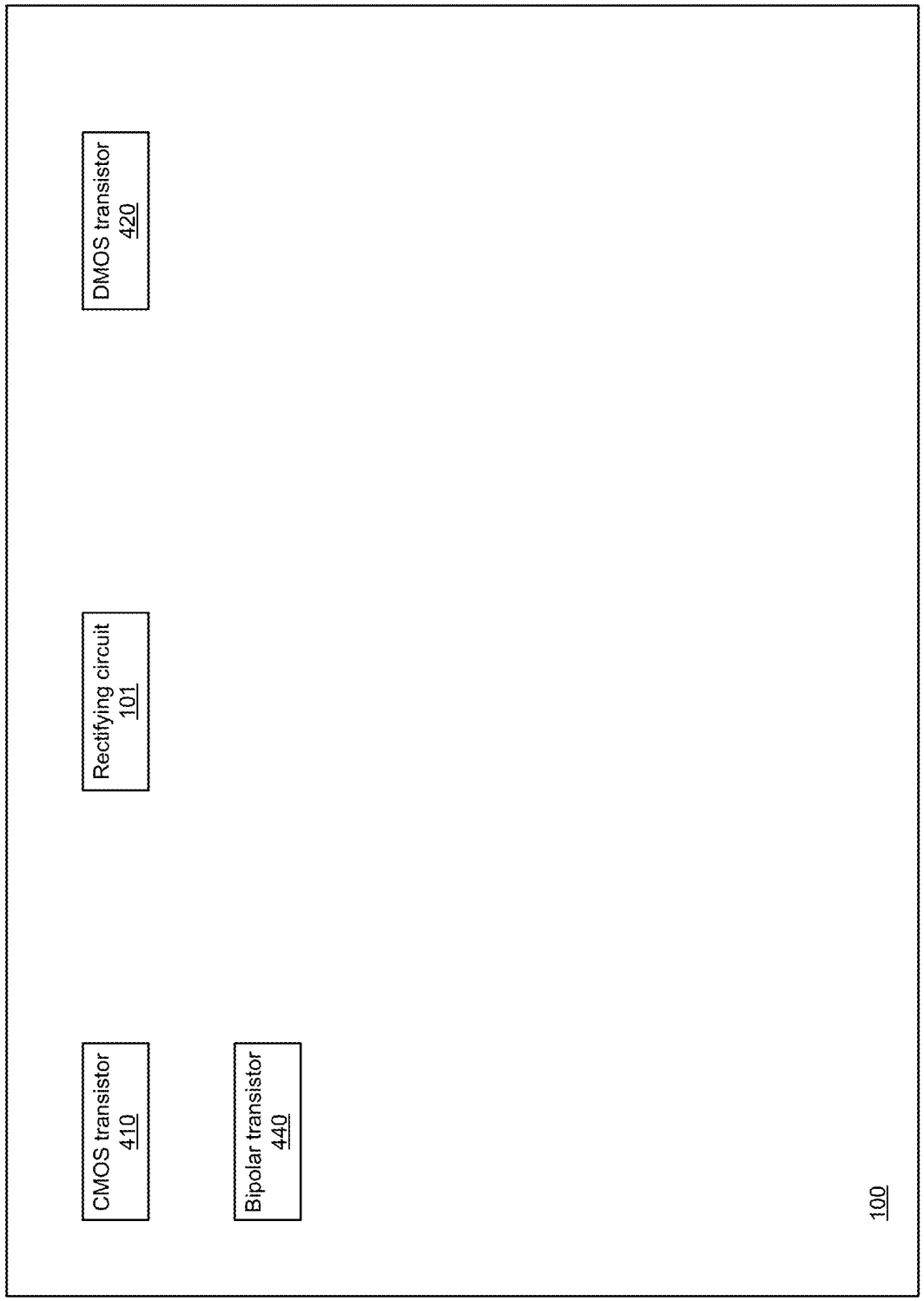
FIG. 9 illustrates a die according to an embodiment of the invention.

FIG. 9 illustrate die 100 according to an embodiment of the invention. Die 100 includes one or more rectifying circuits such as rectifying circuit 101, one or more complementary metal oxide (CMOS) transistors—such as CMOS transistor 410, one or more double diffused metal oxide transistors (DMOS) transistors such as DMOS transistor 420 and one or more bipolar transistors such as bipolar transistor 430.

Die 100 may be manufactured by a bipolar CMOD DMOS (BCD) manufacturing process.

Figure 10:
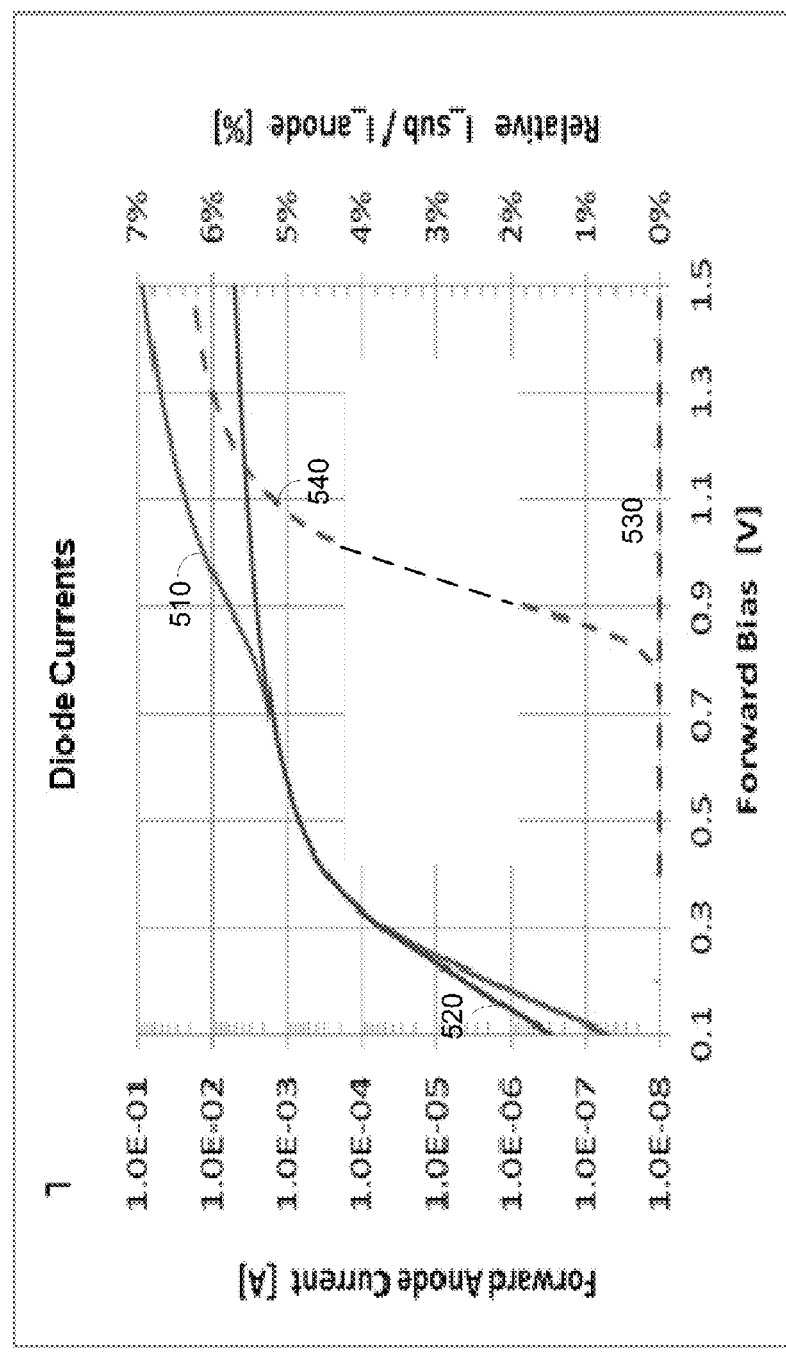
FIG. 10 illustrates energy losses of a prior art rectifying circuit and of a rectifying circuit according to an embodiment of the invention.

FIG. 10 illustrates energy losses of a prior art rectifying circuit and of a rectifying circuit according to an embodiment of the invention.

The x-axis represents the forward bias (bias between Anode to Cathode).

For curves 510 and 520 the y-axis represents the forward anode current—the current that passes through the anode node of the rectifying circuit. Curve 510 represents the forward anode current of a prior art rectifying circuit and curve 520 illustrates the forward anode current a rectifying circuit according to an embodiment of the invention.

For curves 530 and 540 the y-axis represents the loss of current—the ratio between a substrate current (resulting from injection of minority carriers) and between the forward anode current. Curve 540 represents the loss of a prior art rectifying circuit and curve 530 illustrates the lack of loss attributed to a rectifying circuit according to an embodiment of the invention.

Figure 11:
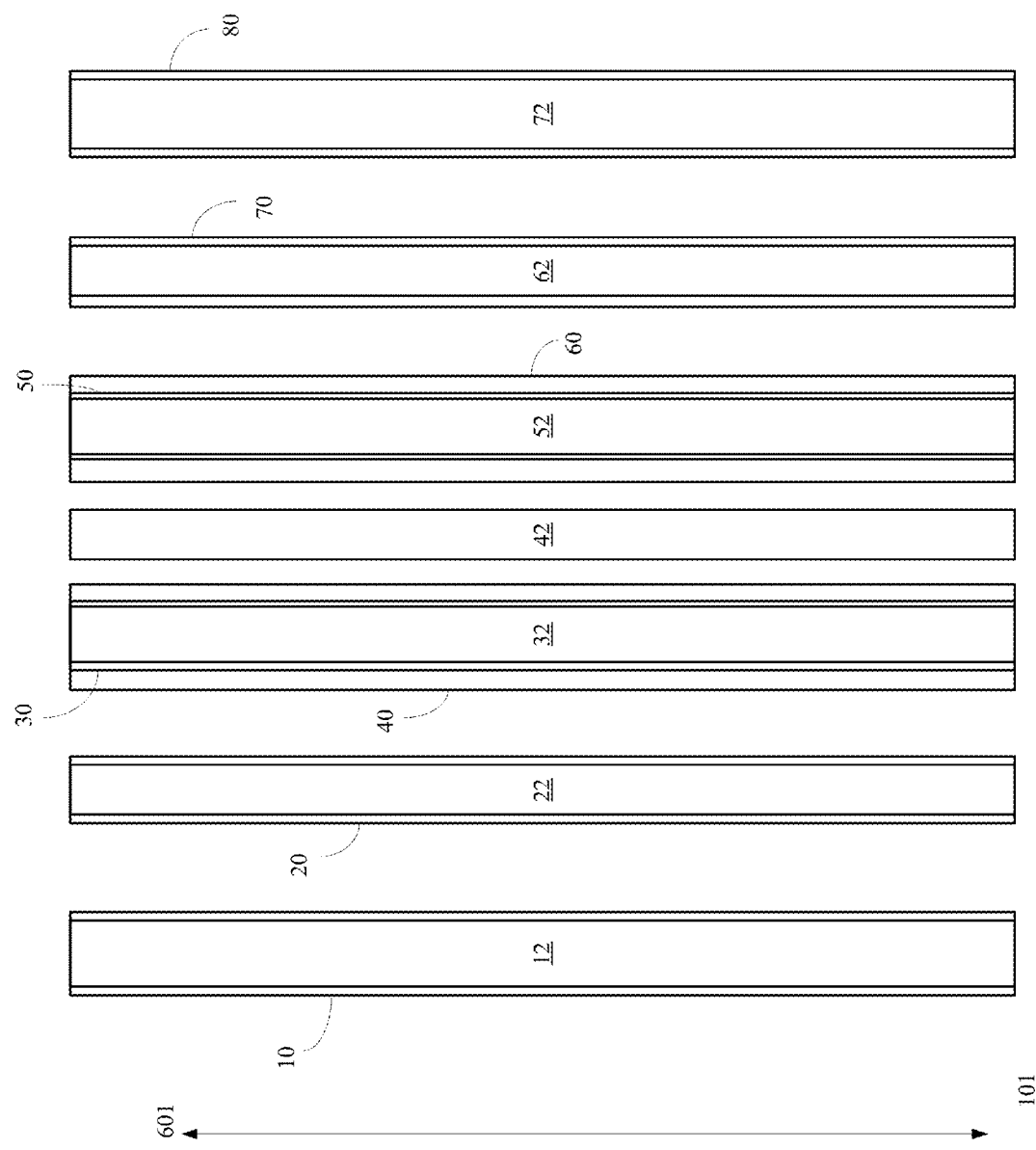
FIG. 11 is a top view of the rectifying circuit according to an embodiment of the invention.
Figure 12:
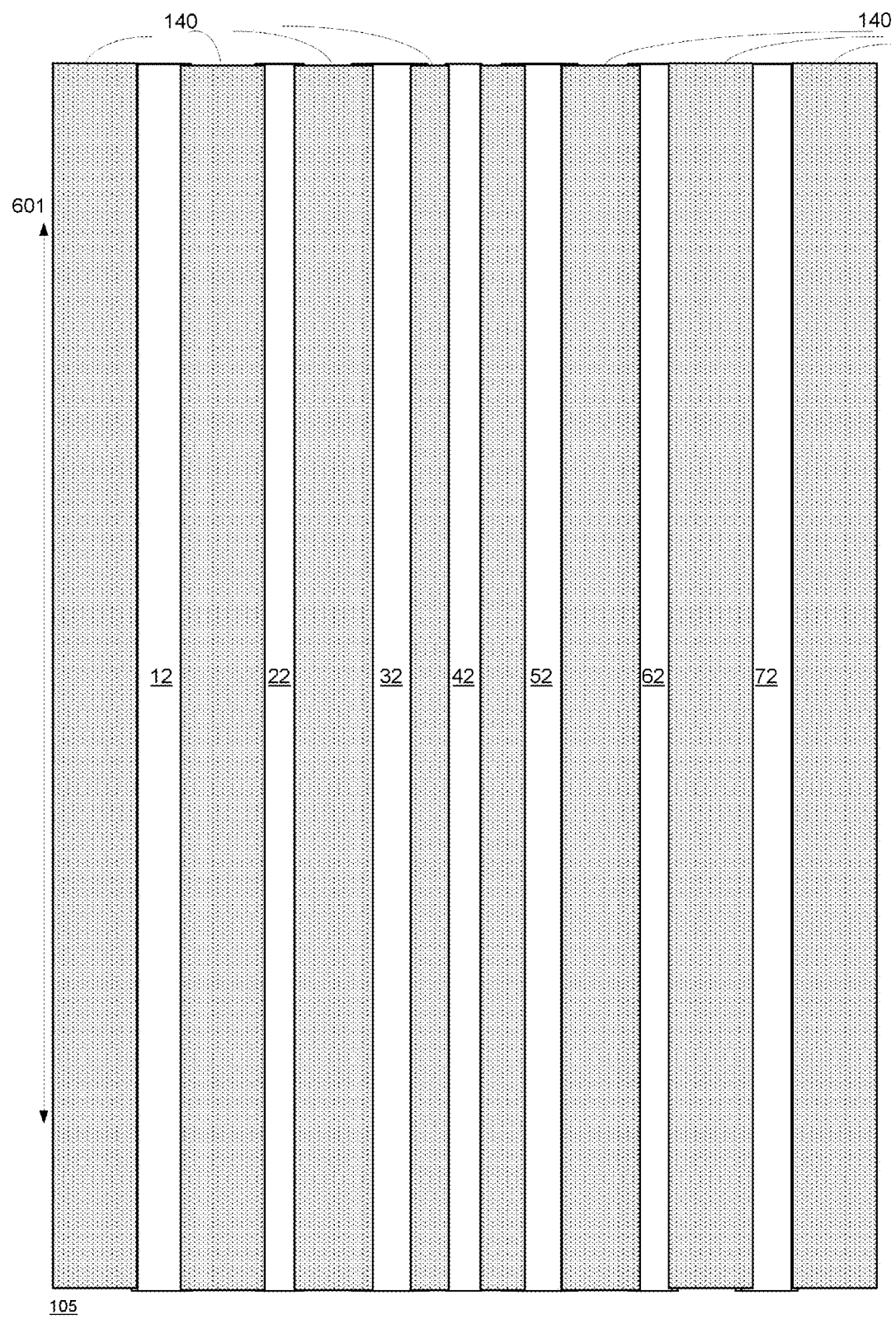
FIG. 12 is a top view of the rectifying circuit according to an embodiment of the invention.

FIG. 11 is a top view of rectifying circuit 101 according to an embodiment of the invention. FIG. 12 is a top view of rectifying circuit 105 according to an embodiment of the invention.

FIGS. 11 and 12 illustrates the first till eighth regions 10, 20, 30, 40, 50, 60, 70, 80 and 90 are shaped as mutually parallel fingers.

Conveniently, the cross sectional views illustrated in FIGS. 1-8 were taken along an imaginary plane of either one of rectifying circuit 101-109. The cross section of each one of these rectifying circuits may remain the same along a longitudinal axis (denoted 601 in FIGS. 11 and 16) of the rectifying device that is normal to the imaginary plane.

According to an embodiment of the invention the cross sections of either one of rectifying circuit 101-108 may change along the longitudinal axis.

Any combination of any rectifying circuits can be provided.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A die, comprising:
a first region of a first type;
a first conductor that contacts the first region;
a substrate having a substrate portion of the first type;
   wherein the substrate portion contacts the first region;
an intermediate region of a second type;
wherein the first type and the second type are selected from an n-type semiconductor and a p-type semiconductor; wherein the first type differs from the second type;
a second region of the second type;
a second conductor that contacts the second region;
a third region of the second type;
a third conductor that contacts the third region;
a fourth region of the first type;

wherein the third region contacts the fourth region and does not contact the intermediate region;
a fourth conductor that contacts the intermediate region to form a first Schottky diode;
wherein a doping concentration of the intermediate region is lower that a doping concentration of each one of the second region and the third region;
wherein a doping concentration of the substrate portion is lower than a doping concentration of the first region; and
wherein the third and fourth conductors are electrically coupled to each other.

2. The die according to claim 1 wherein the third region is prevented from being directly coupled to the intermediate region.

3. The die according to claim 1 comprising a substrate port, a cathode port and an anode port, wherein the cathode port is coupled to the first conductor, the anode port is coupled to the third and fourth conductors and the cathode port is coupled to the second conductor.

4. The die according to claim 1 wherein a maximal distance between each one of the first, second, third, fourth regions does not exceed ten microns.

5. The die according to claim 1 wherein the first type of an n-type semiconductor.

6. The die according to claim 1 wherein the first type is a p-type semiconductor.

7. The die according to claim 1 further comprising:
a fifth region of the second type;
a fifth conductor that contacts the fifth region;
a sixth region of the first type;
wherein the fifth region contacts the sixth region and does not contact the intermediate region;
a seventh region of the second type;
a sixth conductor that contacts the seventh region;
an eighth region of the first type;
a seventh conductor that contacts the eighth region;
wherein the doping concentration of the intermediate region is lower that a doping concentration of each one of the eighth region and the sixth region; and
wherein the fifth conductor is electrically coupled to the fourth and third conductors;
wherein the sixth conductor is electrically coupled to the second conductor;
wherein the seventh conductor is electrically coupled to the first conductor.

8. The die according to claim 1 comprising multiple Schottky diodes and multiple guard regions; wherein each of the multiple Schottky diodes is positioned between two guard regions; wherein each of the multiple Schottky diodes is formed by a conductor and the intermediate region; wherein each of the multiple guard regions is of the second type; wherein each guard region does not contact the intermediate region;
wherein the multiple Schottky diodes comprise the first Schottky diode; wherein the multiple guard regions comprise the fourth region.

9. The die according to claim 8 wherein the multiple Schottky diodes and the multiple guard regions are parallel to each other.

10. The die according to claim 8 wherein the multiple Schottky diodes and the multiple guard regions are electrically coupled in parallel to each other.

11. The die according to claim 1 wherein the fourth region surrounds the third region.

12. The die according to claim 1 wherein the fourth region only partially surrounds the third region.

13. The die according to claim 1 comprising at least one isolating region; wherein the at least one isolation region and the fourth region prevent the third region from contacting the intermediate region.

14. The die according to claim 1 comprising shallow trench isolators that are positioned between the first, second, third and fourth conductors.

15. The die according to claim 1 comprising polysilicon regions that are positioned between the first, second, third and fourth conductors.

16. The die according to claim 1 further comprising complementary metal oxide transistors.

17. The die according to claim 1 further comprising bipolar transistors, complementary metal oxide transistors and double diffused metal oxide transistors.

18. The die according to claim 1 wherein the fourth region is prevented from being directly coupled to either one of the fourth conductor and the fifth conductor.

* * * * *